United States Patent [19]
Honda et al.

[11] 4,433,306
[45] Feb. 21, 1984

[54] AUDIO-FREQUENCY POWER AMPLIFIER

[75] Inventors: Hideo Honda, Yokohama; Chikara Tsuchiya, Tokyo; Yoshiaki Sano, Kawasaki; Toshio Hanazawa, Kawasaki; Harumi Handa, Kawasaki, all of Japan

[73] Assignee: Fujitsu Limited, Kawasaki, Japan

[21] Appl. No.: 279,457

[22] Filed: Jul. 1, 1981

[30] Foreign Application Priority Data

Jul. 4, 1980 [JP] Japan ................................ 55-90537

[51] Int. Cl.³ ............................................. H03H 3/04
[52] U.S. Cl. .................................. 330/297; 330/207 R
[58] Field of Search ................ 330/9, 207 R, 267, 297

[56] References Cited
U.S. PATENT DOCUMENTS 4,330,756 5/1982 Moreau ............................... 330/297

Primary Examiner—James B. Mullins
Assistant Examiner—Gene Wan
Attorney, Agent, or Firm—Staas & Halsey

[57] ABSTRACT

A BTL power amplifier comprises main and inverse amplifier units having the same constitution but producing outputs inverted from each other. A low impedance load is directly connected between the output ports of the main and inverse amplifier units. The present BTL power amplifier further comprises a first operation control circuit which activates only the main amplifier unit after the power switch is turned on, and a second operation control circuit which maintains the output port of the inverse amplifier unit in a floating state for a predetermined period of time after the activation of the main amplifier unit is begun. Thus, the present BTL power amplifier produces no pop noise when the power supply is initiated.

8 Claims, 6 Drawing Figures

AUDIO-FREQUENCY POWER AMPLIFIER

BACKGROUND OF THE INVENTION

The present invention relates to a low-frequency power amplifier, particularly to a direct-coupled power amplifier connected in a bridged configuration.

A direct-coupled power amplifier connected in a bridged configuration, in other words, a bridged transformer less power amplifier (BTL power amplifier) comprises main and inverse amplifier units having the same constitution but producing an inverted output from each other. A low impedance load, such as a loudspeaker, is directly connected between the output ports of the main and inverse amplifier units.

If outputs appear from the main and inverse amplifier units and, furthermore, if the phases of the outputs are different from each other, as shown by the solid and broken lines in FIG. 1a, at a time when the power supply is initiated, pulse signals corresponding to the difference in the voltage, as shown in FIG. 1b, are applied to the loudspeaker. Thus, transitional noises, such as so-called "pop noises" are heard often from the loudspeakers when the power is applied.

SUMMARY OF THE INVENTION

It is, therefore, an object of the present invention to provide an audio-frequency power amplifier which can prevent pop noises from occurring when power is applied thereto.

According to the present invention, an audio-frequency power amplifier comprises: a power switch; a first amplifying means for producing an output; a second amplifying means for producing an output having an inverted phase which is the opposite of the phase of the output from the first amplifying means; a low impedance load directly connected between the output ports of the first and second amplifying means; a first operation control means for activating the first amplifying means, the activation occurring after the closing of the power switch; and a second operation control means for maintaining the output port of the second amplifying means in a floating state for a first predetermined period of time after the activation of the first amplifying means.

The above and other related objects and features of the present invention will be apparent from the description of the present invention set forth below, with reference to the accompanying drawings, as well as from the appended claims.

DESCRIPTION OF THE PREFERRED EMBODIMENT

Figure 1A:
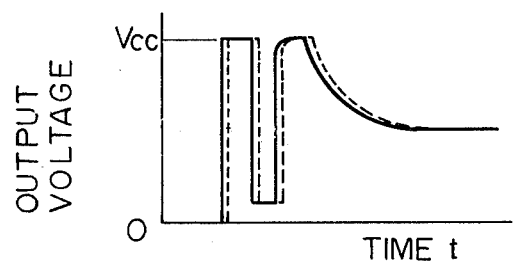
FIGS. 1a and 1b are graphs illustrating the occurrence of pop noises according to the prior art.
Figure 1B:
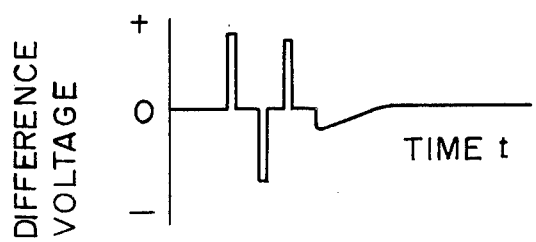
Figure 2:
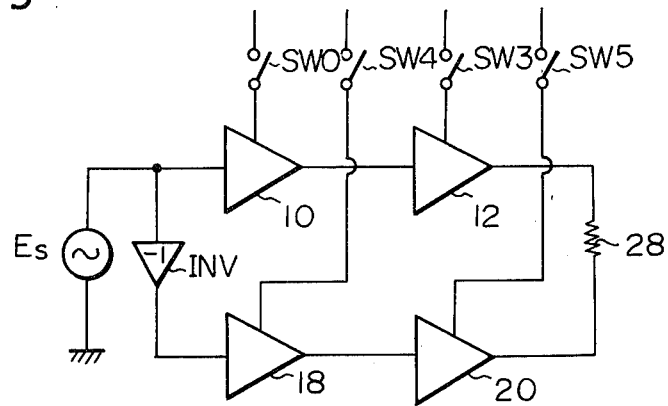
FIG. 2 is a schematic block diagram illustrating the concept of the present invention.

Referring to FIG. 2, which illustrates the concept of the present invention, reference numeral 10 denotes an input stage of a main amplifier unit, 12 is an output stage of the main amplifier unit, 18 is an input stage of an inverse amplifier unit, and 20 is an output stage of the inverse amplifier unit. A low impedance load 28, such as a loudspeaker, is directly connected between the output ports of the output stages 12 and 20.

A signal from a signal source $E_s$ is applied to the input stage 10 without inversion, but the signal from the signal source $E_s$ is inverted by an inverter INV and then applied to the input stage 18. Therefore, although the constitution and function of the main and inverse amplifier units are the same as each other, the output signal from the main and inverse amplifier units are inverted from each other.

Switches SW0, SW4, SW3, and SW5 break or make the connection in bias supply circuits for the respective stages, thereby 10, 18, 12 and 20. If the switches are turned on, the bias voltages are supplied to the respective stages causing the stages to be active. Contrary to this, if the switches are turned off, no bias voltages are supplied, thereby causing the respective stages to be in a floating state.

According to the present invention, these switches SW0, SW4, SW3, and SW5 are turned on, in order, at various intervals, so as to prevent pop noises from occurring. First, only the switch SW0 is turned on, causing the input stage 10 to be active. Next, the switches SW4 and SW3 are turned on at an interval of $T_a$ (FIG. 4), causing the input stage 18 and the output stage 12 to be active. Within the above period of $T_a$, capacitances connected to the intput port of the input stage 10 are fully charged. Then the switch SW5 is turned on at an interval of $T_b$, causing the output stage 20 to be active. Within the periods of $T_a$ and $T_b$, capacitances for stabilizing the bias voltage applied to this power amplifier are fully charged.

During the period of $T_a$, since the output impedances of the main and inverse amplifier units are very high, because the output stages 12 and 20 are in a floating state, no voltage develops across the low impedance load 28. Namely, pop noises are not produced. Furthermore, during the period of $T_b$, since the output impedance of the inverse amplifier unit is very high, because the output stage 20 is still in a floating state, even though the output stage 12 is active, no voltage develops across the load 28. Since the inverse amplifier unit is activated after the bias voltage of the main amplifier unit is completely stabilized, no pop noises occur at the start of the activation of the output stage 20.

Figure 3:
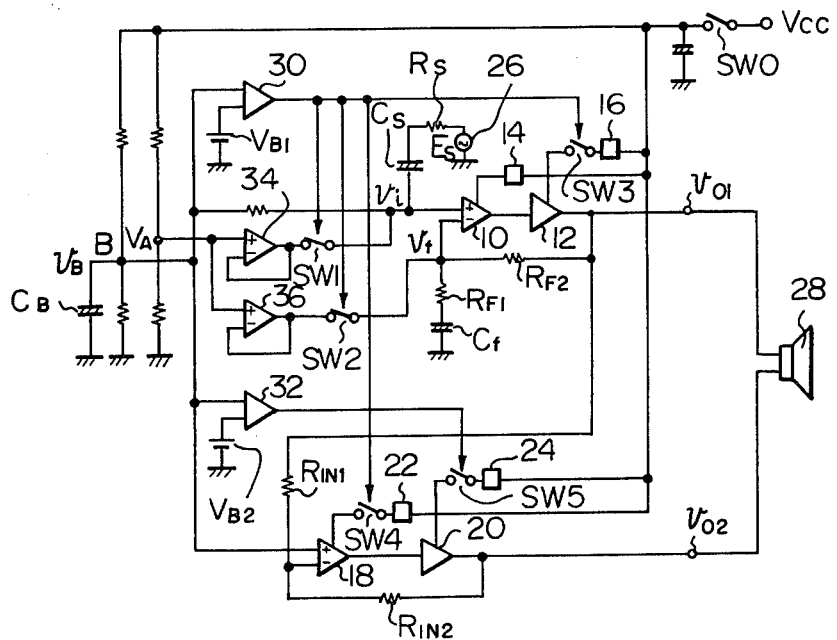
FIG. 3 is a block diagram of an embodiment of the present invention.

FIG. 3 illustrates an embodiment of the present invention. Input stages 10 and 18, output stages 12 and 20, a low impedance load 28, and switches SW0, SW4, SW3 and SW5 illustrated in FIG. 3 are the same as those in FIG. 2. In FIG. 3, reference numerals 14, 16, 22 and 24 denote bias circuits for supplying the bias voltage to the input stage 10, output stage 12, input stage 18 and output stage 20, respectively. Furthermore, in FIG. 3, reference numeral 26 denotes an input signal source, 30 denotes a comparator which compares the voltage developed across a capacitor $C_B$ with a predetermined voltage $V_{B1}$ and generates a first timing signal, 32 denotes a comparator which compares the voltage developed across the capacitor $C_B$ with a predetermined voltage $V_{B2}$ and generates a second timing signal, and 34 and 36 denote voltage followers.

Switches SW1 and SW2 are normally closed switches inserted in respective charging circuits of an input coupling capacitor $C_s$, which is used for cutting d.c. signal and a feedback capacitor $C_f$, which is used for cutting d.c. signal of the feedback terminal. These switches SW1 and SW2 turn off in response to the first timing signal from the comparator.

The switches SW3 and SW4 are normally open switches and turn on in response to the first timing signal from the comparator 30. The switch SW3 is connected between the bias circuit 16 and the output stage 12, and the switch SW4 is connected between the bias circuit 22 and the input stage 18. The switch SW5 is a normally open switch connected between the bias circuit 24 and the output stage 20, and turns on in response to the second timing signal from the comparator 32. The voltage $v_B$ developed across the capacitor $C_B$, which is used to stabilize the bias voltage, is, as aforementioned, compared with predetermined voltages $V_{B1}$ and $V_{B2}$ by the comparators 30 and 32, respectively. This voltage $v_B$ gradually increases from zero up to the final voltage $V_B$ when the power switch SW0 turns on.

Figure 4:
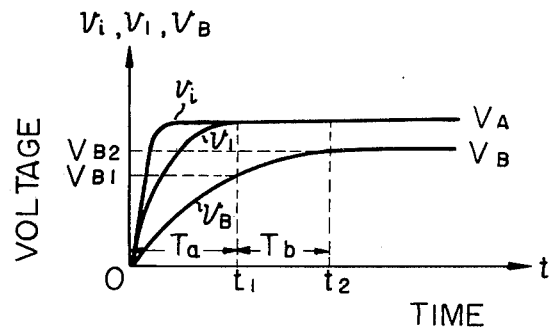
FIG. 4 is a graph of various voltages $v_i$, $v_f$, $v_B$ versus time t.

FIG. 4 illustrates the change of the voltages $v_i$, $v_f$ and $v_B$ at the points in the circuitry of FIG. 3 with respect to the lapse of time after the power supply is initialized. With reference to FIG. 4, the operation of the embodiment shown in FIG. 2 will be illustrated.

When the power switch SW0 is turned on, the capacitor $C_B$ is gradually charged and thus the voltage $v_B$ across the capacitor $C_B$ gradually increases as shown in FIG. 4. While the voltage $v_B$ is lower than the predetermined reference voltage $V_{B1}$ of the comparator 30, in other words, while the lapse of time t after the power switch is closed is $0<t<t_1$, the capacitors $C_s$ and $C_f$ are charged by the current which is fed thereto via the respective voltage followers 34 and 36 so as to stabilize the bias of the input port of the input stage 10. Furthermore, during $0<t<t_1$, since both of the switches SW3 and SW5 are opened, no bias voltage is applied to the output stage 12 and the input stage 18, causing both of the output ports of the main and inverse amplifier units to be in a floating state. Therefore, the output impedances of the main and inverse amplifier units are maintained in a very high state, and the impedance of the load 28 is neglected. Accordingly, an output $v_{02}$ from the inverse amplifier unit follows an output $v_{01}$ from the main amplifier unit, and vice versa, causing no noise to occur from the loudspeaker 28.

When the voltage $v_B$ across the capacitor $C_B$ increases up to $V_{B1}$, the comparator 30 produces a first timing signal and thus the switches SW1 and SW2 are turned off, causing the charging operation of the capacitors $C_s$ and $C_f$ to stop. The reference voltage $V_{B1}$ is determined so that the first timing signal is produced from the comparator 30 when the capacitors $C_s$ and $C_f$ are almost fully charged, when the cross voltages are nearly equal to $V_A$, and when the bias of the input port of the main amplifier unit is stabilized.

According to this embodiment, as mentioned hereinbefore, since the charging circuit for the bias stabilization of only the input stage 10 is provided, stabilization thereof is performed within a very short time.

In response to the first timing signal, furthermore, the switches SW3 and SW4 are turned off. Thus, the bias voltage is supplied the output stage 12 and to the input stage 18, causing the main amplifier unit and the input stage 18 to be active. This condition is maintained in order to stabilize the output from the main amplifier unit while the voltage $v_B$ is lower than the predetermined reference voltage $V_{B2}$ of the comparator 32, but higher than the reference voltage $V_{B1}$ of the comparator 30, in other words, when the lapse of time t after the power switch is closed is $t_1<t<t_2$. During $t_1<t<t_2$, since the output port of the inverse amplifier unit is still in a floating state, an output $v_{02}$ from the inverse amplifier unit follows the output $v_{01}$ from the main amplifier. Namely, the output $V_{02}$ is equal to the output $v_{01}$. Therefore, no noise occurs.

When the voltage $v_B$ across the capacitor $C_B$ increases to $V_{B2}$, which is near the finally stabilized voltage $V_B$ ($V_B > V_{B2}$), the comparator 32 produces a second timing signal and thus the switch SW5 is turned on. As the switch SW5 is closed, the bias voltage is supplied to the output stage 20, causing the inverse amplifier unit to be active. Then, the BTL power amplifier operates in the ordinary way, namely, it initiates the signal amplifying operation. Since the present BTL power amplifier initiates the signal amplifying operation at the time $t_2$ after the output of the main amplifier unit is completely stable, no noise, such as pop noises, occur at the initiation of the signal amplifying operation.

Figure 5:
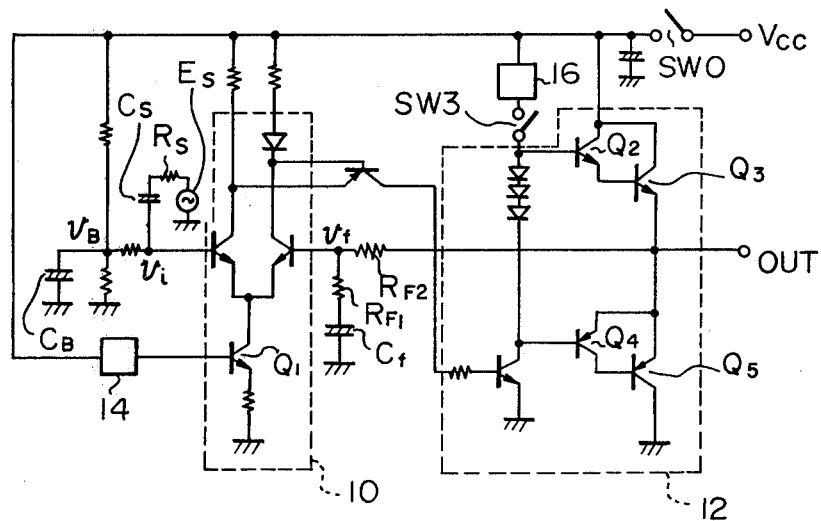
FIG. 5 is a detailed circuit diagram of the main amplifier unit shown in FIG. 3.

FIG. 5 illustrates a detailed circuit construction corresponding to a part of the circuitry in FIG. 3. As is shown in FIG. 5, the input stage 10 of the main amplifier unit comprises a differential amplifier, and the bias circuit 14 is connected to the base of a transistor $Q_1$ in the input stage 10. If the bias voltage is supplied from the bias circuit 14, the transistor $Q_1$ becomes conductive, causing the input port 10 to activate. In FIG. 5, the output stage 12 of the main amplifier unit comprises a push-pull amplifier of complementary symmetry. As is apparent from FIG. 5, if the switch SW3 opens, no bias voltage is supplied to the power transistors $Q_2$ through $Q_5$ in the Darlington connection, causing the output port to be in a floating state. Contrary to this, if the switch SW3 closes, the bias voltage is supplied, causing the output stage 12 to be inactive.

As will be apparent from the foregoing description, the BTL power amplifier according to the present invention comprises a first operation control circuit, which activates the main amplifier unit after the power switch is closed, and a second operation control circuit, which maintains the output port of the inverse amplifier unit in a floating state for a predetermined period of time after the activation of the main amplifier unit is begun. Therefore, no difference in voltage between the output voltages of the main and inverse amplifier units appears until the signal amplifying operation of the BTL power amplifier starts. Furthermore, since the signal amplifying operation is started after the main amplifier unit is fully stabilized, no pop noise occurs.

As many widely different embodiments of the present invention may be constructed without departing from the spirit and scope of the present invention, it should be understood that the present invention is not limited to the specific embodiments described in this specification, except as defined in the appended claims.

We claim:

1. An audio-frequency power amplifier comprising:
a power switch through which a power supply voltage is provided when said power switch is closed;
first amplifying means for producing an output signal at an output port;
second amplifying means for producing an output signal at an output port, said output signal having a phase which is the inverse of the phase of the output signal from said first amplifying means;
a low impedance load directly connected between the output ports of said first and second amplifying means;

first operation control means, operatively connected to said power switch and said first amplifying means, for activating said first amplifying means after the closing of said power switch; and second operation control means, operatively connected to said power switch and said second amplifying means, for maintaining the output port of said second amplifying means in a floating state for a first predetermined period of time after said first amplifying means is activated, and for activating said second amplifying means, after said first predetermined period of time, by providing the power supply voltage to said second amplifying means.

2. An audio-frequency power amplifier as claimed in claim 1, wherein said first amplifying means includes a first input stage and a first output stage, and wherein said first operation control means activates said first input stage when said power switch is closed and maintains said first output stage in a floating state for a second predetermined period of time after said power switch is closed.

3. An audio-frequency power amplifier as claimed in claim 1,
wherein said second amplifying means includes a second input stage operatively connected to said first operation control means, and a second output stage,
wherein said first operation control means activates said second input stage after a second predetermined period of time after the close of said power switch, and
wherein said second operation control means maintains said second output stage in a floating state for a third predetermined period of time after the activation of said second input stage.

4. An audio-frequency power amplifier as claimed in claim 1,
wherein said first amplifying means includes a first input stage and a first output stage,
wherein said second amplifying means includes a second input stage operatively connected to said first operation control means, and a second output stage,
wherein said first operation control means activates said first input stage when said power switch is closed, maintains said first output stage and said second input stage in a floating state until a second predetermined period of time after the activation of said first input stage, and activates said first output stage and said second input stage after the second predetermined period of time elapses, said second predetermined period of time being shorter than said first predetermined period of time, and
wherein said second operation control means maintains said second output stage in a floating state until the first predetermined period of time elapses.

5. An audio-frequency power amplifier as claimed in claim 2 or 4, wherein said first operation control means comprises:
means for comparing a first bias voltage with a first predetermined voltage and for generating a control signal which indicates the comparison result; and
means, responsive to said control signal, for supplying a second bias voltage to activate said first output stage when said control signal indicates that the first bias voltage is greater than or equal to the first predetermined voltage.

6. An audio-frequency power amplifier as claimed in claim 3 or 4, wherein said second operation control means comprises:
means for comparing a first bias voltage with a second predetermined voltage and for generating a control signal which indicates the comparison result; and
means, responsive to said control signal, for supplying a second bias voltage to activate said second output stage when said control signal indicates that the first bias voltage is greater than or equal to the second predetermined voltage.

7. An audio-frequency power amplifier as claimed in claim 2 or 4, wherein said first operation control means includes means for quickly stabilizing a bias voltage applied to said first input stage by additionally feeding a charging current to said first input stage during said second predetermined period.

8. An audio-frequency power amplifier for amplifying an input signal, comprising:
a power switch having first and second positions, a power supply voltage being provided through said power switch when said power switch is in the first switch position;
first operation control means for generating a first activation signal after a first predetermined period of time after said power switch is placed in the first switch position;
second operation control means for generating a second activation signal after a second predetermined period of time, greater than said first predetermined period of time, after said power switch is placed in the first switch position;
a first amplifier having a first input stage operatively connected to said power switch and operatively connectable to receive the input signal, and having a first output stage operatively connected to said first input stage and said first operation control means, said first input stage being activated when said power switch is placed in the first switch position, said first output stage being maintained in a floating state until said first operation control means generates said first activation signal, said first output stage generating an output signal;
a second amplifier having a second input stage operatively connected to said first operation control means and operatively connectable to receive the input signal, and having a second output stage operatively connected to said second input stage and said second operation control means, said second input stage being activated in dependence upon said first activation signal, said second output stage being maintained in a floating state until said second activation signal is received from said second operation control means, said second output stage generating an output signal; and
a load operatively connected to said first and second output stages.

* * * * *

UNITED STATES PATENT AND TRADEMARK OFFICE
CERTIFICATE OF CORRECTION

PATENT NO. : 4,433,306
DATED : FEBRUARY 21, 1984
INVENTOR(S) : HIDEO HONDA ET AL.

It is certified that error appears in the above-identified patent and that said Letters Patent is hereby corrected as shown below:

Col. 1, line 10, "former less" should be --former-less--;
       line 59, "t" should be --$\underline{t}$--.

Col. 2, line 15, delete ", thereby";
       line 17, "stages" should be --stages, thereby--.

Col. 3, line 19, "v$f$and" should be --v$f$ and--;
       line 29, "t" should be --$\underline{t}$--;
       line 68, "t" should be --$\underline{\bar{t}}$--.

Col. 4, line 16, "t2" should be --$\underline{t}_2$--.

Signed and Sealed this

Twenty-seventh Day of November 1984

[SEAL]

Attest:

GERALD J. MOSSINGHOFF

Attesting Officer    Commissioner of Patents and Trademarks